US010617165B2

(12) United States Patent
Ngo Ngoc et al.

(10) Patent No.: US 10,617,165 B2
(45) Date of Patent: Apr. 14, 2020

(54) COMPUTER-IMPLEMENTED METHOD FOR DEFINING SEAMS OF A VIRTUAL GARMENT OR FURNITURE UPHOLSTERY (71) Applicant: Dassault Systemes, Velizy Villacoublay (FR)

(72) Inventors: Cyril Ngo Ngoc, Asnieres-sur-Seine (FR); Auxkin Ortuzar Del Castillo, Saint-Cloud (FR); Denis Nouais, Clamart (FR)

(73) Assignee: Dassault Systemes, Velizy Villacoublay (FR)

( * ) Notice: Subject to any disclaimer, the term of this patent is extended or adjusted under 35 U.S.C. 154(b) by 377 days.

(21) Appl. No.: 15/286,254

(22) Filed: Oct. 5, 2016

(65) Prior Publication Data
US 2017/0105468 A1 Apr. 20, 2017

(30) Foreign Application Priority Data
Oct. 14, 2015 (EP) ..................................... 15306633

(51) Int. Cl.
*G06T 19/20* (2011.01)
*A41H 3/00* (2006.01)
*G06F 30/00* (2020.01)

(52) U.S. Cl.
CPC ............. *A41H 3/007* (2013.01); *G06F 30/00* (2020.01); *G06T 19/20* (2013.01); *G06T 2210/16* (2013.01); *G06T 2219/2008* (2013.01)

(58) Field of Classification Search
CPC ......... A41H 3/007; G06F 17/50; G06T 19/20; G06T 2210/16; G06T 2219/2008
(Continued)

(56) References Cited

U.S. PATENT DOCUMENTS 7,663,648 B1 * 2/2010 Saldanha ................ G06T 17/00
345/419
8,355,811 B2 * 1/2013 Isogai .................. G06F 17/5018
700/132
(Continued)

FOREIGN PATENT DOCUMENTS

WO WO 2012/061834 A1 5/2012

OTHER PUBLICATIONS

Durupannar_2007 (A virtual Garment Design and Simulation System, 11th International Conference Information Visualization (IV' 2007).*
(Continued)

*Primary Examiner* — Brian S Cook
(74) *Attorney, Agent, or Firm* — Hamilton, Brook, Smith & Reynolds, P.C.

(57) ABSTRACT

A computer-implemented method defines seams of a virtual garment or upholstery having a plurality of two-dimensional patterns (P) assembled by their edges (E0-E7). The method arranges said patterns around a three-dimensional avatar (AV). The position of each pattern depends on its situation within the assembled garment or upholstery. Next the method for each edge (E0) of each pattern, except edges previously identified as seamless or for which a seam has already been defined:

b1) automatically identifies at least one edge (E1 -E7), called candidate edge, which is suitable to be seamed to it;

b2) if a plurality of candidate edges have been identified, selects one of them (E1) based on at least one geometric criterion; and b3) defines a seam between the edge and the selected, or the only, candidate edge.

A computer program product, a non-volatile computer-readable data-storage medium and a Computer Aided
(Continued)

Design system for carrying out such a method. Application of such a method to the manufacturing of a real garment or upholstery.

12 Claims, 8 Drawing Sheets

(58) Field of Classification Search
USPC .............................................................. 703/1
See application file for complete search history.

(56) References Cited

U.S. PATENT DOCUMENTS

| | | | |
|---|---|---|---|
| 8,364,561 B2* | 1/2013 | Wolper | G06T 17/00 700/132 |
| 8,700,447 B2* | 4/2014 | Chappell | G06F 17/30867 705/14.45 |
| 2014/0114620 A1* | 4/2014 | Grinspun | A41H 3/007 703/1 |

OTHER PUBLICATIONS

Berthouzoz_2013 (Parsing Sewing Patterns into 3D Garments, 2013 Journal AMC Transactions on Graphics (TOG) vol. 32 Issue 4, Jul. 2013 Artricle No. 85 (Year: 2013).*

Li_2014 (Automatic Tailoring and Cloth Modelling for Animation Characters, Bouremouth University, Jun. 2014) (Year: 2014).*

European Search Report, European Counterpart Application No. EP 15 30 6633, Date of Completion of Search: Apr. 28, 2016, 11 pages.

Funda Durupynar et al: "A Virtual Garment Design and Simulation System", Information Visualization, 2007. IV '07. 11$^{th}$ International Conference, IEEE, PI, Jul. 1, 2007 (Jul. 1, 2007 ), pp. 862-870, XP031115775, ISBN: 978-0-7695-2900-4.

Liu Y J et al: "A survey on CAD methods in 3D garment design", Computers in Industry, Elsevier Science Publishers. Amsterdam, NL, val. 61, No. 6, Aug. 1, 2010 (Aug. 1, 2010), pp. 576-593, XP027080059, ISSN: 0166-3615, DOI: 10.1016/J.COMPIND.2010. 03.007 [retrieved on Jun. 8, 2010].

* cited by examiner

COMPUTER-IMPLEMENTED METHOD FOR DEFINING SEAMS OF A VIRTUAL GARMENT OR FURNITURE UPHOLSTERY

RELATED APPLICATION(S)

This application claims priority under 35 U.S.C. § 119 or 365 to Europe, Application No. 15306633.7, filed Oct. 14, 2015. The entire teachings of the above application(s) are incorporated herein by reference.

BACKGROUND

The invention relates to the field of computer-aided design. More precisely, it concerns a computer-implemented method for defining seams of a virtual garment or furniture upholstery comprising a plurality of two-dimensional patterns assembled by their edges. It also concerns a computer-aided design system, computer program product and a non-volatile computer-readable data-storage medium containing computer-executable instructions to cause a computer system to carry out such a method, as well as a method of manufacturing a real garment.

In the following, the word "avatar" will be used broadly to designate a computer-generated, usually three-dimensional, representation of a human or animal body, a humanoid or zoomorphic creature, or even a vegetable or an inanimate object (e.g. a piece of furniture such as a sofa). Most often, however, the avatar will be a representation of a human or humanoid body. The avatar may be designed ab initio, or it may be reconstructed by scanning a real body or object.

The words "virtual garment" or "virtual upholstery" will refer to a computer-generated bi-dimensional or (most often) three-dimensional representation of clothing, upholstery or the like, suitable to be worn by an avatar. The virtual garment may be a model of a "real" garment suitable to be manufactured in the physical world. In the following, only the case of garments will be discussed, but all equally applies to upholstery.

Avatars and virtual garments are preferably "three-dimensional" (3D). Hereafter, a "three-dimensional" object will be an object—or a digital model thereof—allowing a three-dimensional representation, which allows the viewing of the parts from all angles.

The word "pattern" will designate a piece of fabric, leather or other flexible material suitable to be used to manufacture a garment. A garment is most often manufactured by assembling several patterns by their edges. Patterns are usually considered two-dimensional, as they are developable (they can lie flat on a plane) and their thickness is negligible (smaller by at least two orders of magnitude) over their other dimensions.

A "seam" is a junction between two edges of two different patterns, or of the same pattern. Typically, the word "seam" used alone will not refer to an "internal seam" which is a junction between two edges of two different patterns or of a same pattern corresponding to an elementary pattern construction and associated to styling elements such as darts, pleats, iron lines, pockets, notches . . . Seams are most often realized by sewing or stitching, but other techniques such as gluing may be used in some cases.

Computer-aided techniques have been widely used in the development process of pattern-making in the fashion industry. Specifically, CAD (Computer Aided Design) and CAM (Computer Aided Manufacturing) systems have helped to produce digital 2D patterns which are then used to manufacture garments. These patterns are generally described as two-dimensional boundary curves enriched with additional information needed to physically construct the final garment. Several CAD systems exist on the market from companies such as Lectra Systèmes, Gerber Technology, Optitex, Human Solutions Assyst, Co3D (Marvelous Designer). The modules they propose present common characteristics and are mainly focused on 2D patterns development, CAD-CAM management and manufacturing (e.g. pattern layout and cut with automatic machine).

With the emergence of 3D, virtual clothing is becoming a standard and it requires new techniques to assemble virtually the 2D patterns in order to get the virtual garment. Unfortunately, the 2D patterns created with standard CAD systems lack information about how to assemble and sew them efficiently. In fact, most of the existing 2D CAD pattern models are conceived for design or cutting of unassembled textile parts. Thus, they do not provide assembly and finishing instructions or such information is not well defined for an automatic manufacturing. Generally, to get the full sequence of sewing, human tailors have to rely on their experience and understanding of the conventions of sewing patterns in the real word.

Figure 1:
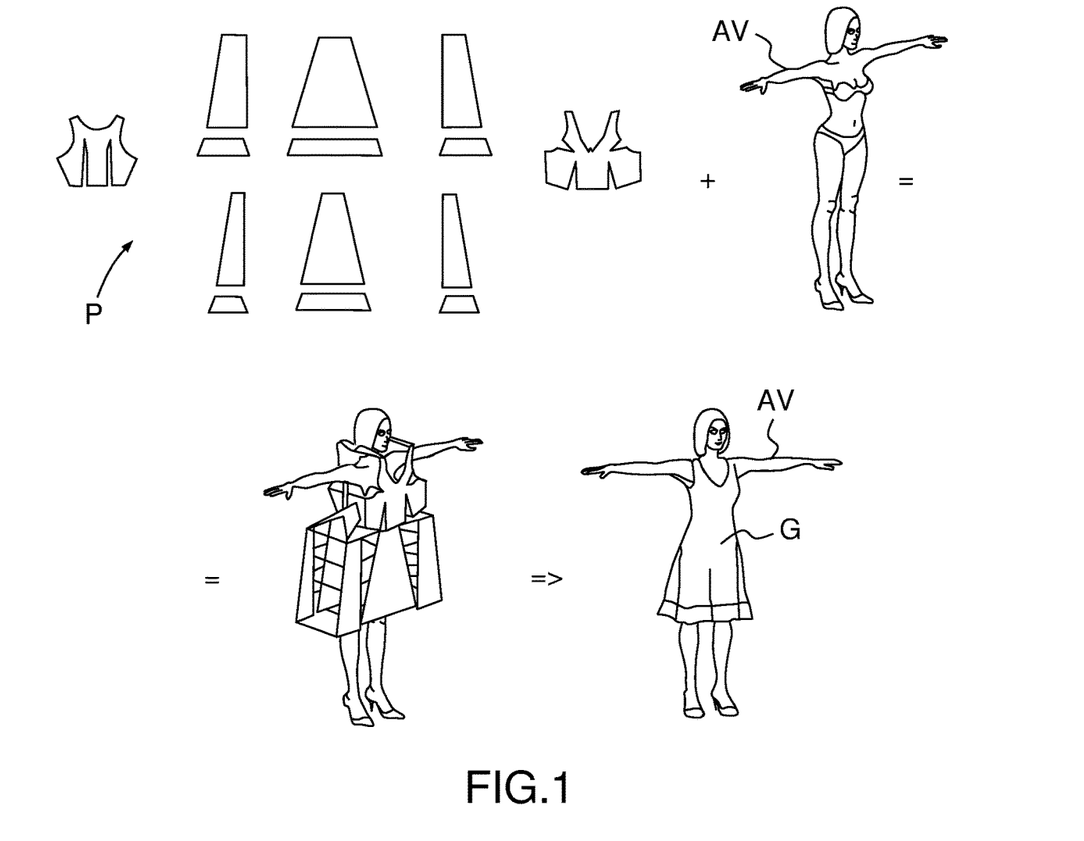
FIG. 1 illustrates the prior art.

FIG. 1 shows the general pipeline of a 3D virtual garment prototyping method.

First of all, a set of 2D patterns P of the virtual garment and an avatar AV are provided. As it has been already mentioned, 2D CAD patterns may come from standard industry pattern-marker software; in some cases, they may be obtained by scanning and digitally processing "physical" patterns made of paper. The 3D avatar is created by an artist, generated from anthropometrical survey analysis or obtained from body measurements (e.g. 3D scanning). Then the patterns are positioned around the avatar and assembled using seam definitions. Finally, physical simulation is performed to drape the assembled garment G.

Pattern positioning and seams definition are crucial since they define the starting state for the garment simulation; if they are not provided or not well defined, the simulation will fail. Many research works have been performed concerning the automatic pre-positioning of patterns (see References 1-4 cited later) and proposed by some commercial software like Vidya from Human Solutions. But little progress has been made concerning automatic seam definition, and today 3D design garment modules require that the user manually specifies which edge has to be sewn to another one.

To alleviate this problem of automatic sewing definition there are two approaches that have been proposed by the research community.

One is based on a sketching approach (see Reference 6) which directly generates the 3D geometry of the garment on a 3D avatar. Designers simply draw curves on 3D meshes to create seams. This approach is limited since it cannot produce complex garments and the 3D geometries generated are not guaranteed to be developable, which does not allow to get pattern pieces for the garment manufacturing.

The second method (see Reference 5) tries to parse sewing patterns in PDF (Portable Document Format) format and to determine how the panels must be stitched together based on machine learning and integer programming. This method successfully extracts 68% of the sewing patterns and need users corrections. Such performances are insufficient for most applications.

SUMMARY OF THE INVENTION

The invention aims at overcoming this drawbacks of the prior art and to provide an effective method of performing automatic or at least semi-automatic definition of seams of virtual garments, thus avoiding, at least in part, the tedious and time-consuming task of manually defining seams.

An object of the present invention, allowing achieving this aim, is a computer-implemented method for defining seams of a virtual garment or upholstery comprising a plurality of two-dimensional patterns assembled by their edges, the method comprising the steps of:

a) arranging said patterns around a three-dimensional avatar, the position of each pattern depending on its situation within the assembled garment or upholstery; and b) for each edge of each pattern, except edges previously identified as seamless:
  b1) automatically identifying at least one edge, called candidate edge, which is suitable to be seamed to it;
  b2) if a plurality of candidate edges have been identified, selecting one of them based on at least one geometric criterion; and
  b3) defining a seam between the edge and the selected, or the only, candidate edge;
said steps b1), b2) and b3) being performed automatically by a computer.

According to particular embodiments of such a method:

Said step b1) may comprise identifying as candidate all the edges which have not been identified as seamless, for which no seam has already been defined and having a length equal to that of said edge within a predetermined tolerance.

Said step b2) may comprise selecting one candidate edge based on at least one criterion chosen among: minimal distance from said edge; minimal orientation mismatch with said edge; orientation mismatch with said edge lower than a threshold; and the fact that a seam with said edge would not intersect the avatar.

Said step b2) may comprise sorting the candidate edges according to their distance from said edge.

Said step b2) may further comprise filtering out the candidate edge with the shortest distance from said edge if it fulfills a set of conditions, called impossibility conditions, comprising at least one among: an orientation mismatch with said edge higher than a threshold; and the fact that a seam with said edge would intersect the avatar.

The method may further comprise a step of:
c) allowing a user to manually suppress a seam defined at step b3), and/or to manually define an additional seam.

The method may further comprise a step of:
d) assembling the virtual garment or upholstery around the avatar according to the defined seams and performing a physical simulation of its draping.

The method may further comprise a step of importing said two-dimensional patterns from a two-dimensional graphic file and arranging them around said three-dimensional avatar following inputs from a user.

Said step a) may comprise using three-dimensional computer-aided-design software tools to design said two-dimensional patterns around said three-dimensional avatar.

At least one of said two-dimensional patterns may comprise at least one edge pre-identified as seamless.

At least one of said two-dimensional patterns may comprise at least a pair of edges between which an internal seam is pre-defined.

The method may further comprise a step of identifying seamless edges and pair of edges between which an internal seam is pre-defined, said step being carried out before said step b1).

Another object of the invention is a computer program product, stored on a non-volatile computer-readable data-storage medium, comprising computer-executable instructions to cause a computer system to carry out such a method.

Another object of the invention is a non-volatile computer-readable data-storage medium containing computer-executable instructions to cause a computer system to carry out such a method.

Another object of the invention is a Computer Aided Design system comprising a processor coupled to a memory and a graphical user interface, the memory storing computer-executable instructions to cause the Computer Aided Design system to carry out such a method.

Another object of the invention is a method of manufacturing a garment or upholstery comprising a plurality of two-dimensional patterns assembled by their edges, the method comprising:
  a step of designing said garment or upholstery, including a sub-step of defining seams between said patterns by such a method; and
  a step of physically manufacturing said garment or upholstery, including assembling said patterns by realizing said seams.

Another object of the invention is a garment or upholstery obtained by said method of manufacturing.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

Additional features and advantages of the present invention will become apparent from the subsequent description, taken in conjunction with the accompanying drawings, wherein.

DETAILED DESCRIPTION OF THE INVENTION

A description of example embodiments of the invention follows.

Figure 2:
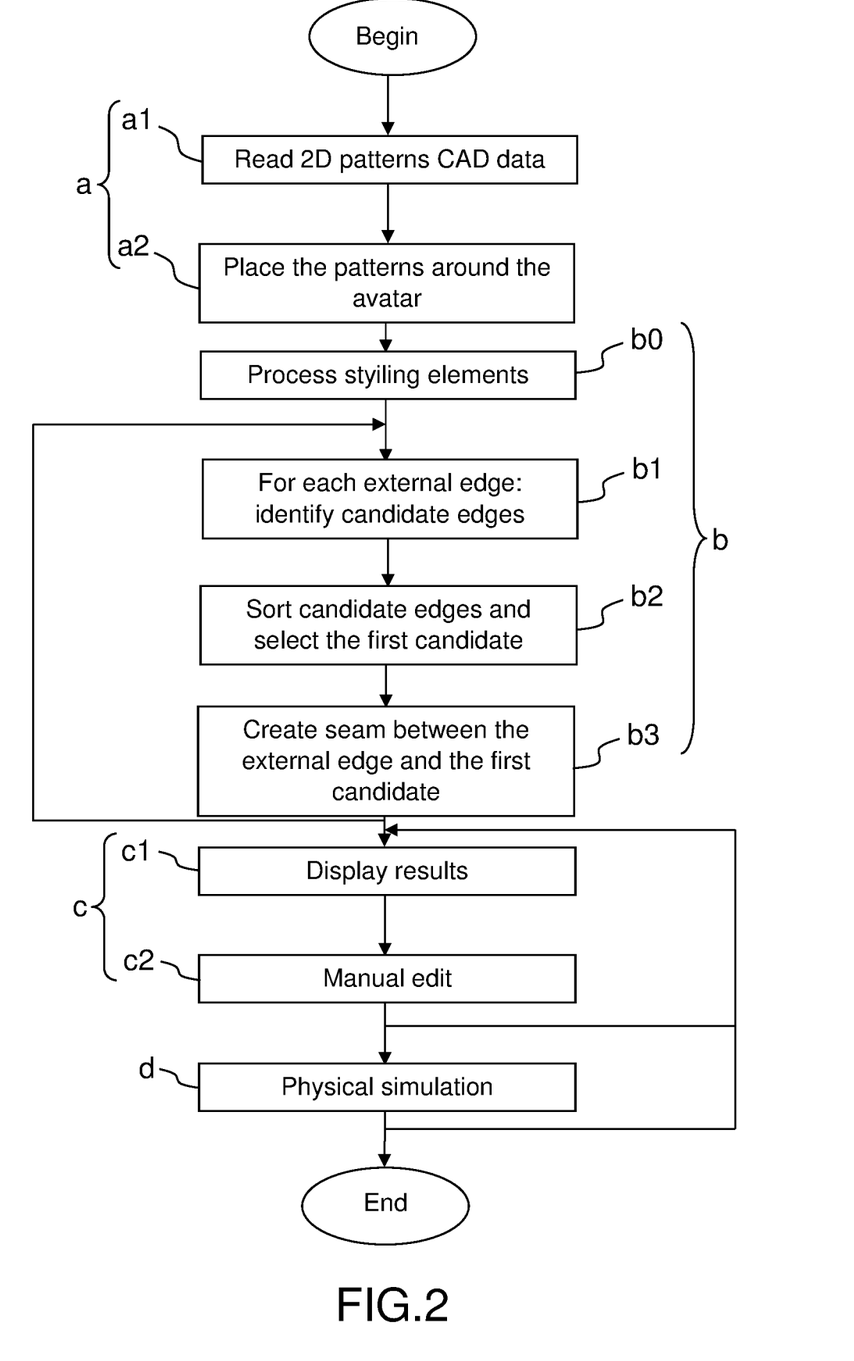
FIG. 2 is a flow-chart of a method according to an embodiment of the invention.

The flow-chart of FIG. 2 illustrates the steps of a method according to an embodiment of the invention.

First of all (step 'a', sub-step 'a1') a set of 2D patterns is imported from a CAD file, or defined by a user using a CAD tool. Each pattern comprises:
  a polyline corresponding to the edges; and
  styling elements (darts, pleats, hemlines, iron lines, etc . . . ).

Some edges may be labeled as "seamless", which means that they will not be stitched to any other edge of the same or of a different pattern. Heuristic rules may also be used to identify seamless edges in a fully or partially automated way. For example, if a set of patterns corresponds to a trouser or skirt, it will be possible to consider that the bottom edges are seamless (or that they include an internal seam to make a hem).

Figure 3A:
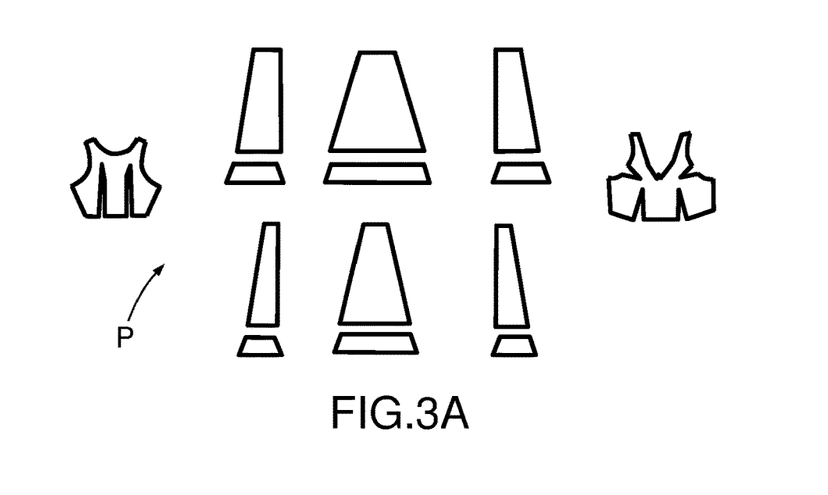
FIGS. 3A, 3B, 3C, 3D, 3E and 3F illustrate different steps of the method of FIG. 2.

Such a pattern set is illustrated on FIG. 3A.

Then (sub-step 'a2', FIG. 3B) the 2D patterns P are shown on a computer display and placed around a 3D avatar AV, also shown on the same display, e.g. by drag-and-drop. It is important that the position of each pattern depend on its situation within the assembled garment; more precisely, each pattern should have a position which is approximately the same it will occupy within the assembled garment. Otherwise stated, each pattern should be positioned in front of the part of the avatar's body it will cover when the garment is assembled.

Figure 3B:
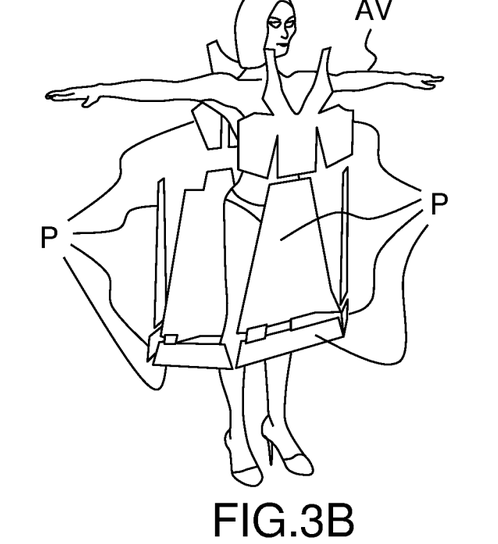

Alternatively, the patterns can be directly created in the right position using a 3D CAD tool. In this case, sub-steps 'a1' and 'a2' are merged.

Then, a sewing editor—i.e. a computer program according to an embodiment of the invention—is launched to perform seam identification.

The first operation of the sewing editor (step 'b', sub-step 'b0') consists in processing styling elements such as darts, pleats, iron lines, pockets, notches, etc. The information allowing identifying these elements is included in the 2D patterns. The sewing editor processes the styling elements to create "implicit" seams corresponding to these specifications. For instance, in FIG. 3C, the "internal" edges IE1 and 1E2 are part of a dart, so they are associated to each other through a seam which is identified as a dart seam.

Figure 3C:
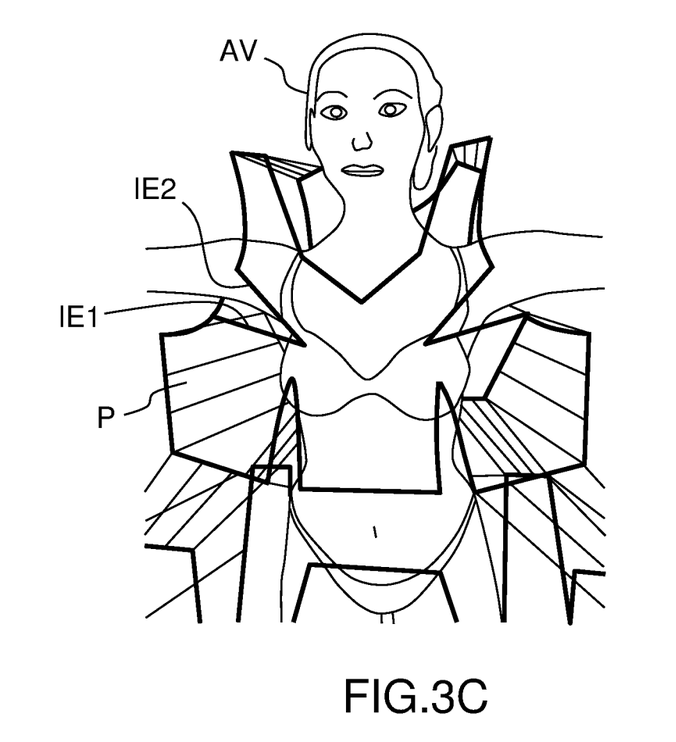

Heuristic rules may also be used for the automatic identification of internal seams. For example, there is an internal seam between two adjacent edges of a pattern forming a concave acute angle, which is characteristic of a dart. Also, pockets may be easily identified, and they have characteristics internal seams which may be defined automatically.

The identification of the other seams, which are not associated to styling elements, is an iterative process, carried out for each external (i.e. not "internal", otherwise stated not corresponding to a styling element) edge of each pattern, except those—if any—which are labeled as "seamless".

So, for a given "external" edge:
One or more "candidate" edges are identified; these are edges which are "compatible" with the edge under consideration—i.e. they are suitable to be stitched to it to form a seam (sub-step 'b1').
If several candidate edges are found, one of them is selected based on one or more geometric criteria (sub-step 'b2').
Finally, a seam is created between the edge under consideration and the first candidate edge of the sorted list (sub-step 'b3').

According to a preferred embodiment of the invention, the candidate edges identified at sub-step 'b1' are all the (external) edges and having the same length than the edge under consideration, within a predetermined tolerance or allowance (e.g. 5 mm, or 1%). Indeed, except in exceptional cases, only edges of the same length are stitched together. It is important to note that an edge can be stitched to several other edges, so that edges already belonging to a seam should not be excluded from the candidate list.

If several candidate edges are identified, the selection sub-step 'b2' may advantageous comprise sorting them based on geometric criteria and picking up the first candidate edge of the sorted list. For instance, multiple candidate edges may be sorted by distance: indeed, the closer are two edges, the more they are likely to be stitched together.

Figure 3D:
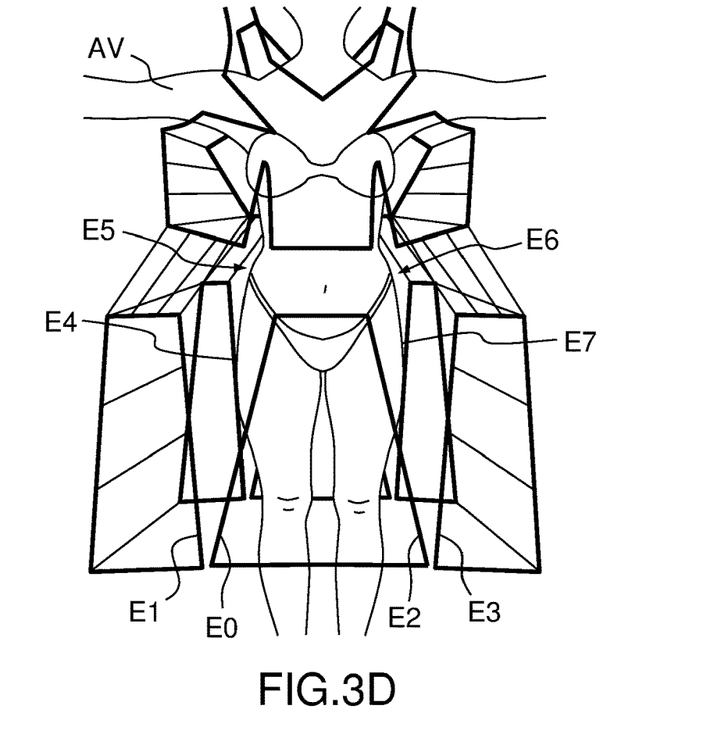

On FIG. 3D, reference E0 designates the edge under consideration, and references E1-E7 the corresponding candidate edges, sorted by increasing distance (edges E5 and E6 are not visible, as they are hidden by the avatar's body).

Advantageously, the sorting sub-step 'b2' also takes into account additional parameters, such as the orientation mismatch of the edges (i.e. the angle between them). For instance, it is possible to compute a weighted average of said parameters.

According to a preferred embodiment, the closest edge (E1 on the example of FIG. 3D) is tested to check for "impossibility" conditions, which are incompatible with the existence of a seam. For example, impossibility may result from an orientation mismatch exceeding a threshold value such as 45°, or from the fact that the seam would intersect the avatar's body (this would be the case, for example, of a seam between edge E0 and one of edges E5, E6, E7 on FIG. 3D). If the closest edge fulfills an impossibility condition, it is "filtered out" by moving it to the bottom of the list, then the second-closest one is checked, and so on.

Alternatively, the test of impossibility conditions may be included in sub-step 'b1'; in this case it is guaranteed that no candidate edge fulfills an impossibility condition. This embodiment, however, is less efficient, because all the edges have to be checked instead of only the closest one(s).

Creating the seam (sub-step 'b3') may simply include creating a logical link between two edges, i.e. attributing a specific value to an "association" property of said edges.

Figure 3E:
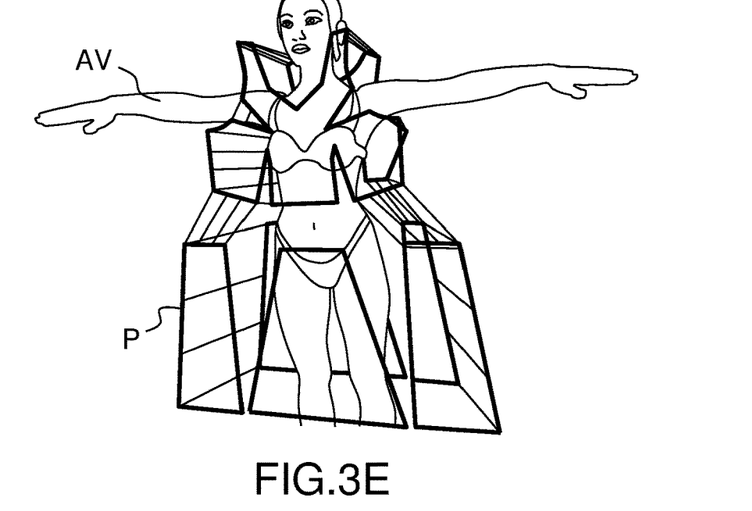

When the seam definition steps have been performed for all the external edges of the set of pattern, the seams are displayed through dashed lines connecting edges (step 'c', sub-step 'c1' and FIG. 3E).

At this point, advantageously, the user can edit manually the automatically identified seams, by suppressing or modifying them and/or by adding additional seams (sub-step 'c2'). Indeed, it is generally preferred that a human user has the last word, automatic detection being only used to propose the most likely seams.

Figure 3F:
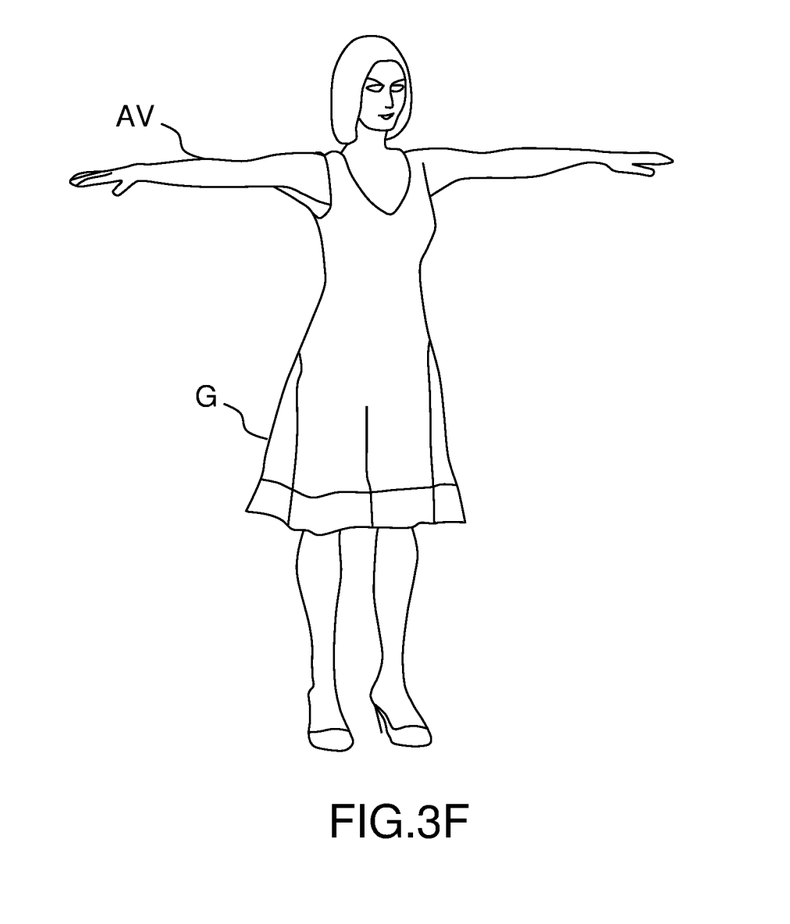

After the editing step, or directly at the end of the automatic seam creation step, the garment G obtained by assembling the patterns along the seams may be draped on the avatar AV using physical modeling software tools known in the art (step 'd' and FIG. 3F). This allows identifying errors in the seam definition, which can then be corrected by iterating the editing step.

The inventive method produces a set of 2D patterns "enriched" with seam definitions, which can be used for physically manufacturing a garment. The physical manufacturing step typically includes cutting the patterns into fabrics and assembling them, usually by sewing, according to the seam definitions.

The inventive method also produces a virtual garment, formed by assembling 2D pattern and therefore realistic, which may be used to dress an avatar, e.g. for computer graphics applications.

Figure 4:
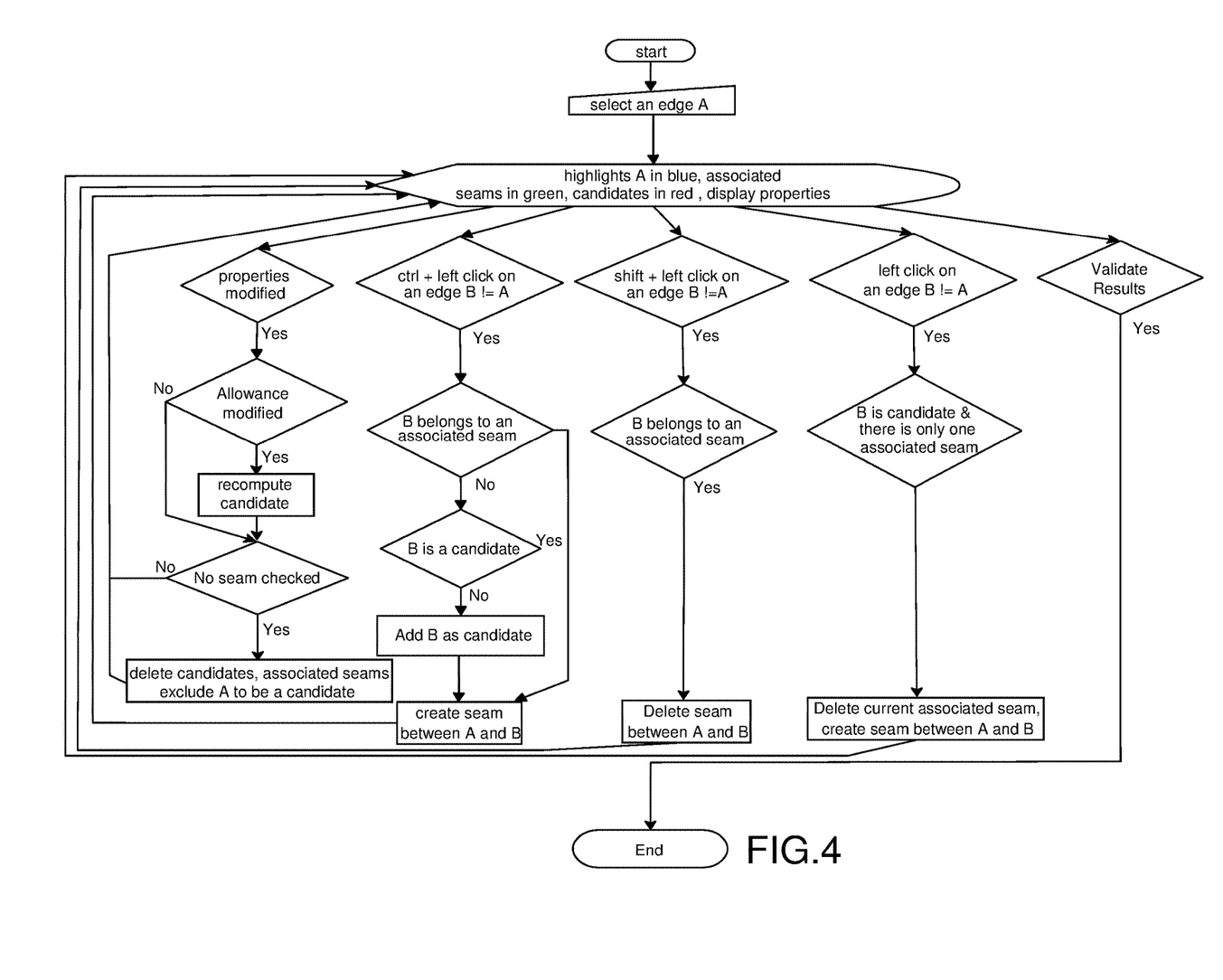
FIG. 4 is a flow-chart of an editing step of the method of FIG. 2.

An exemplary embodiment of the editing step will now be described in detail with reference to FIGS. 4, 5A and 5B.

First of all, the user selects an edge, e.g. using a mouse. The edge A is then highlighted, together with its associated seam(s) and its candidate edges. Different colors can be used for these elements; for instance, the edge A may be displayed in blue, the "associated" edge—i.e. the one with which a seam is formed—and the dotted lines representing the seams in green and the other candidate edges in red. Properties of the edges may also be displayed in a window.

Then, the user can:

Validate the result, in which case the editing ends.

Modify one or more properties of the selected edge A, e.g. by defining it a seamless (or vice-versa), modifying the tolerance, or allowance. Then, as a result, the set of candidate edges is recomputed and re-sorted. If the edge has been defined as seamless (e.g. a "no seam" box has been checked), the corresponding candidate list is canceled, the edge is deleted from all the candidate lists and all existing association involving the seam is deleted.

Select a new edge B different from A. Several possibilities are then available:

If the user inputs a first commands—e.g. performs a left click on edge B while pressing the "control" key—a seam is created between A and B. If B is not already a candidate edge, it is added to the list of candidates. As a consequence, edge A may have more than one associated edge, and therefore it may belong to more than one seam.

If the user inputs a second commands—e.g. performs a left click on edge B while pressing the "shift" key—and B is associated to A, the seam between A and B is deleted.

If the user inputs a third commands—e.g. performs a left click on edge B without pressing any key—B is a candidate edge other than the associated edge, and there is only one associate edge (and therefore A only belongs to one seam), then the existing seam is deleted and a new one is created between A and B.

Figure 5A:
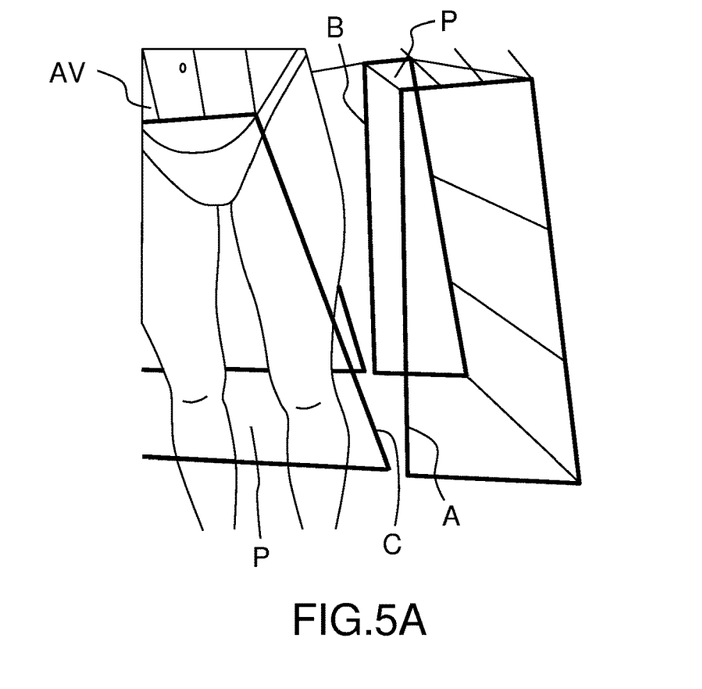
FIGS. 5A and 5B illustrate said editing step.
Figure 5B:
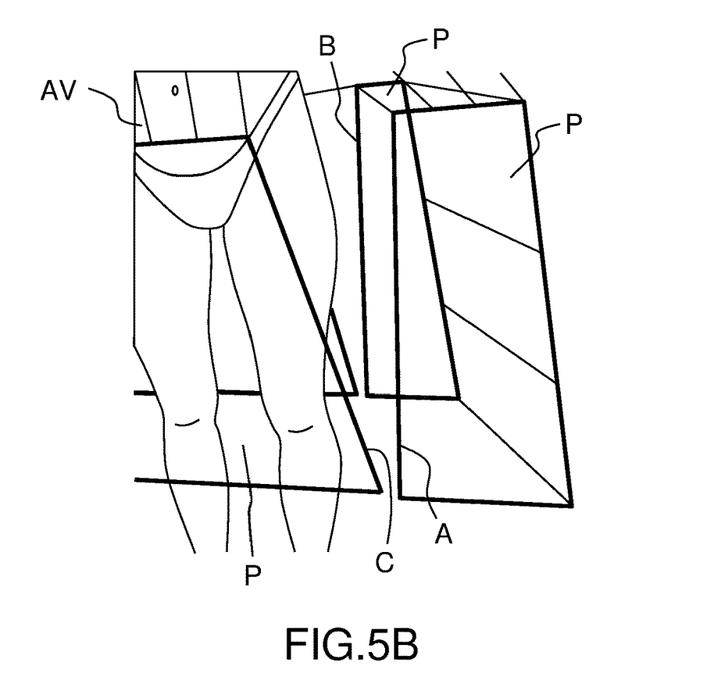

For instance, FIG. 5A shows a situation where edge A is associated to edge C, i.e. a seam exist between them. Edge B is a candidate edge for A, but no seam exists between A and B. The user positions a pointer on edge B using a mouse and performs a left click on edge B while pressing the "shift" key. Then, the seam between A and C is canceled and a new seam between A and B is created. The result is illustrated on FIG. 5B.

The inventive method can be performed by a suitably-programmed general-purpose computer or computer system, possibly including a computer network, storing a suitable program in non-volatile form on a computer-readable medium such as a hard disk, a solid state disk or a CD-ROM and executing said program using its microprocessor(s) and memory.

Figure 6:
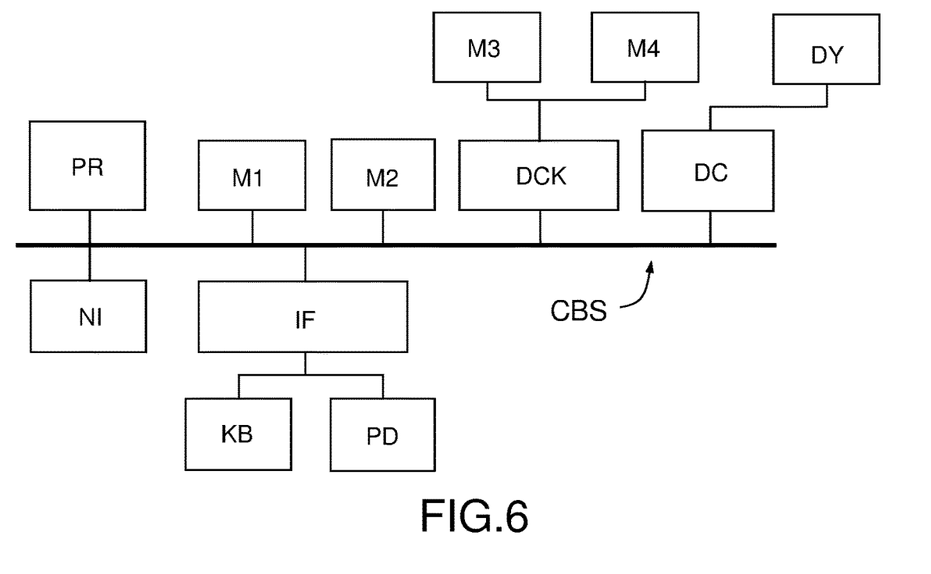
FIGS. 6 and 7 are block diagrams of respective computer systems suitable for carrying out a method according to an embodiment of the invention.

A computer—more precisely a computer aided design station—suitable for carrying out a method according to an exemplary embodiment of the present invention is described with reference to FIG. 6. In FIG. 6, the computer includes a Central Processing Unit (CPU) PR which performs the processes described above. The process can be stored as an executable program, i.e. a set of computer-readable instructions in memory, such as RAM M1 or ROM M2, or on hard disk drive (HDD) M3, DVD/CD drive M4, or can be stored remotely. An avatar database, and a pattern database—i.e. organized sets of digital models of avatars and garment patterns in a form suitable to be processed by the executable program according to the inventive method—may also be stored on one or more of memory devices M1 to M4, or remotely.

The claimed invention is not limited by the form of the computer-readable media on which the computer-readable instructions and/or the avatar and garment databases of the inventive process are stored. For example, the instructions and databases can be stored on CDs, DVDs, in FLASH memory, RAM, ROM, PROM, EPROM, EEPROM, hard disk or any other information processing device with which the computer aided design station communicates, such as a server or computer. The program and the database can be stored on a same memory device or on different memory devices.

Further, a computer program suitable for carrying out the inventive method can be provided as a utility application, background daemon, or component of an operating system, or combination thereof, executing in conjunction with CPU PR and an operating system such as Microsoft VISTA, Microsoft Windows 7, UNIX, Solaris, LINUX, Apple MAC-OS and other systems known to those skilled in the art.

CPU PR can be a Xenon processor from Intel of America or an Opteron processor from AMD of America, or can be other processor types, such as a Freescale ColdFire, IMX, or ARM processor from Freescale Corporation of America. Alternatively, the CPU can be a processor such as a Core2 Duo from Intel Corporation of America, or can be implemented on an FPGA, ASIC, PLD or using discrete logic circuits, as one of ordinary skill in the art would recognize. Further, the CPU can be implemented as multiple processors cooperatively working to perform the computer-readable instructions of the inventive processes described above.

The computer aided design station in FIG. 6 also includes a network interface NI, such as an Intel Ethernet PRO network interface card from Intel Corporation of America, for interfacing with a network, such as a local area network (LAN), wide area network (WAN), the Internet and the like. The computer aided design station further includes a display controller DC, such as a NVIDIA GeForce GTX graphics adaptor from NVIDIA Corporation of America for interfacing with display DY, such as a Hewlett Packard HPL2445w LCD monitor. A general purpose I/O interface IF interfaces with a keyboard KB and pointing device PD, such as a roller ball, mouse, touchpad and the like. The display, the keyboard and the pointing device, together with the display controller and the I/O interfaces, form a graphical user interface.

Disk controller DKC connects HDD M3 and DVD/CD M4 with communication bus CBS, which can be an ISA, EISA, VESA, PCI, or similar, for interconnecting all of the components of the computer aided design station.

A description of the general features and functionality of the display, keyboard, pointing device, as well as the display controller, disk controller, network interface and I/O interface is omitted herein for brevity as these features are known.

Figure 7:
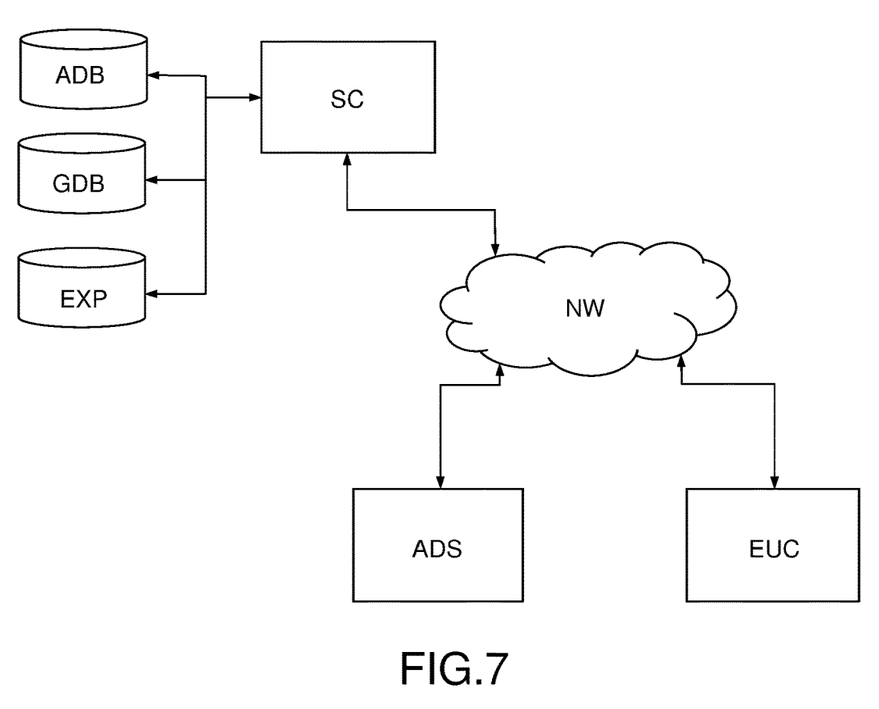

FIG. 7 is a block diagram of a computer system suitable for carrying out a method according to a different exemplary embodiment of the present invention.

In FIG. 7, the executable program EXP, the avatar database ADB and the garment pattern database GDB are stored on memory devices connected to a server SC. The memory devices and the overall architecture of the server may be the same as discussed above with reference to FIG. 6, except that display controller, display, keyboard and/or pointing device may be missing in the server.

The server SC is then connected to an administrator system ADS and end user computer EUC via a network NW.

The overall architectures of the administrator system and of the end user computer may be the same as discussed above with reference to FIG. 6, except that the memory devices of the administrator system and the end user computer do not store the executable program EXP, the avatar database ADB and the garment pattern database GDB. However, the end user computer does store a client program designed for cooperating with the executable program of the server, as it will be discussed below.

As can be appreciated, the network NW can be a public network, such as the Internet, or a private network such as an LAN or WAN network, or any combination thereof and can also include PSTN or ISDN sub-networks. The network NW can also be wired, such as an Ethernet network, or can be wireless such as a cellular network including EDGE, 3G and 4G wireless cellular systems. The wireless network can also be Wi-Fi, Bluetooth, or any other wireless form of communication that is known. Thus, the network NW is merely exemplary and in no way limits the scope of the present advancements.

The client program stored in a memory device of the end user computer and executed by a CPU of the latter accesses the avatar and garment pattern databases on the server via the network NW. This allows an end user to select an avatar and a set of patterns forming a garment adapted to said avatar, and to arrange the patterns around said avatar. The server performs the processing as described above with reference to FIGS. 2 to 3F, and allows the user to perform the editing step described above with reference to FIGS. 4, 5A and 5B. It then transmits the patterns enriched with seaming data to the end user computer, again using the network NW.

Although only one administrator system ADS and one end user system EUX are shown, the system can support any number of administrator systems and/or end user systems without limitation. Similarly, multiple servers, avatar databases and garment pattern databases can also be implemented in the system without departing from the scope of the present invention.

Any processes, descriptions or blocks in flowcharts described herein should be understood as representing modules, segments, or portions of code which include one or more executable instructions for implementing specific logical functions or steps in the process, and alternate implementations are included within the scope of the exemplary embodiment of the present invention.

REFERENCES

1) "Interaction-free dressing of virtual humans" Arnulph Fuhrmanna, Clemens Gross, Volker Luckasa, Andreas Weberb, Computers & Graphics (2003).
2) "An automatic modeling of human bodies from sizing parameters" Hyewon Seo and Nadia Magnenat-Thalman, Proceedings of the 2003 Symposium on Interactive 3D graphics.
3) "The space of human body shapes: reconstruction and parameterization from range scans" Brett Allen, Brian Curless, B. Buxton and P. Treleaven, Transaction on graphics ACM Siggraph 2003.
4) "Automatic pre-positioning of virtual clothing" Clemens Gross, Arnulph Fuhrmann and Volker Luckas, Datenverarbeitung, Darmstadt, Germany SCCG '03 Proceedings of the 19th spring conference on Computer graphics.
5) "Parsing Sewing Patterns into 3D Garments", Floraine Berthouzoz, Akash Garg, Danny Kaufman, Eitan Grinspun, Maneesh Agrawala SIGGRAPH 2013, July 2013. pp. 85:1-85:12.
6) "Sketching garments for virtual characters" Emmanuel Turquin, Marie-Paule Cani and John F. Hughes EUROGRAPHICS Workshop on Sketch-Based Interfaces and Modeling (2004).

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method for defining seams of a virtual garment or upholstery comprising a plurality of two-dimensional patterns assembled by edges of the patterns, the method comprising the steps of:
    arranging said patterns around a three-dimensional avatar representing either a human or humanoid body or a piece of furniture, the position of each pattern depending on its situation within the assembled garment or upholstery, each pattern having a plurality of edges and at least one pattern having an edge previously identified as seamless;
    for each edge of each pattern, except edges previously identified as seamless:
        (i) automatically identifying at least one candidate edge which is suitable to be seamed to the edge;
        (ii) if a plurality of candidate edges have been identified, selecting one of the plurality of candidate edges based on at least one three-dimensional geometric criterion, wherein selecting one of the plurality of candidate edges comprises:
            sorting the candidate edges according to their distance from the edge; and
            filtering out a candidate edge with a shortest distance from the edge if it fulfills a set of impossibility conditions, said impossibility conditions comprising at least an orientation mismatch with the edge higher than a threshold; and
        (iii) defining a seam between the edge and the selected, or the only, candidate edge; and
    assembling the virtual garment or upholstery around the avatar according to the defined seams and performing a physical simulation of draping of the virtual garment or upholstery;
    said identifying, selecting, defining, assembling, and performing being performed automatically by a computer.

2. A method according to claim 1 wherein automatically identifying at least one candidate edge comprises identifying as candidate edges all the edges which have not been identified as seamless, for which no seam has already been defined and having a length equal to that of said edge within a predetermined tolerance.

3. A method according to claim 1 wherein selecting one of the plurality of candidate edges comprises selecting one candidate edge based on at least one criterion chosen among:
    minimal distance from said edge;
    minimal orientation mismatch with said edge;
    orientation mismatch with said edge lower than a threshold; and
    said edge being configured such that a seam with said edge would not intersect the avatar.

4. A method according to claim 1 further comprising at least one of:
    allowing a user to manually suppress a seam defined at defining a seam between the edge and the selected, or the only, candidate edge and allowing a user to manually define an additional seam.

5. A method according to claim 1 wherein arranging said patterns comprises importing said two-dimensional patterns from a two-dimensional graphic file and arranging said patterns around said three-dimensional avatar following inputs from a user.

6. A method according to claim 1 wherein arranging said patterns comprises using three-dimensional computer-aided-design software tools to design said two-dimensional patterns around said three-dimensional avatar.

7. A method according to claim 1 wherein at least one of said two-dimensional patterns comprise at least a pair of edges between which an internal seam is pre-defined.

8. A method according to claim 1 further comprising, before identifying at least one candidate edge, identifying seamless edges and a pair of edges between which an internal seam is pre-defined.

9. A computer system for defining seams of a virtual garment or upholstery comprising a plurality of two-dimensional patterns assembled by edges of the patterns, the computer system comprising:
- a non-volatile non-transitory computer-readable data-storage medium, having computer-readable program code embodied therewith, the computer-readable program code comprising computer-executable instructions for causing the computer system to:
- arrange said patterns around a three-dimensional avatar representing either a human or humanoid body or a piece of furniture, the position of each pattern depending on its situation within the assembled garment or upholstery, each pattern having a plurality of edges and at least one pattern having an edge previously identified as seamless;
- for each edge of each pattern, except edges previously identified as seamless:
  - (i) automatically identify at least one candidate edge which is suitable to be seamed to the edge;
  - (ii) if a plurality of candidate edges have been identified, select one of the plurality of candidate edges based on at least one three-dimensional geometric criterion, wherein selecting one of the plurality of candidate edges comprises:
    - sorting the candidate edges according to their distance from the edge; and
    - filtering out a candidate edge with a shortest distance from the edge if it fulfils a set of impossibility conditions, said impossibility conditions comprising at least an orientation mismatch with the edge higher than a threshold; and
  - (iii) define a seam between the edge and the selected, or the only, candidate edge; and
- assemble the virtual garment or upholstery around the avatar according to the defined seams and perform a physical simulation of draping of the virtual garment or upholstery;
- said identifying, selecting, defining, assembling, and performing being performed automatically by a processor.

10. A non-volatile non-transitory computer-readable data-storage medium comprising:
- memory space containing computer-executable instructions to cause a computer to define seams of a virtual garment or upholstery comprising a plurality of two-dimensional patterns assembled by edges of the patterns, said defining seams being by:
  - arranging said patterns around a three-dimensional avatar representing either a human or humanoid body or a piece of furniture, the position of each pattern depending on its situation within the assembled garment or upholstery, each pattern having a plurality of edges and at least one pattern having an edge previously identified as seamless;
  - for each edge of each pattern, except edges previously identified as seamless:
    - (i) automatically identifying at least one candidate edge which is suitable to be seamed to the edge;
    - (ii) if a plurality of candidate edges have been identified, selecting one of the plurality of candidate edges based on at least one three-dimensional geometric criterion, wherein selecting one of the plurality of candidate edges comprises:
      - sorting the candidate edges according to their distance from the edge; and
      - filtering out a candidate edge with a shortest distance from the edge if it fulfils a set of impossibility conditions, said impossibility conditions comprising at least an orientation mismatch with the edge higher than a threshold; and
    - (iii) defining a seam between the edge and the selected, or the only, candidate edge; and
  - assembling the virtual garment or upholstery around the avatar according to the defined seams and performing a physical simulation of draping of the virtual garment or upholstery;
- said identifying, selecting, defining, assembling, and performing being performed automatically by the computer.

11. A Computer Aided Design system comprising:
- a processor coupled to a memory and a graphical user interface;
- the memory storing computer-executable instructions to cause the Computer Aided Design system to define seams of a virtual garment or upholstery comprising a plurality of two-dimensional patterns assembled by edges of the patterns, said defining by:
- arranging said patterns around a three-dimensional avatar representing either a human or humanoid body or a piece of furniture, the position of each pattern depending on its situation within the assembled garment or upholstery, each pattern having a plurality of edges and at least one pattern having an edge previously identified as seamless;
- for each edge of each pattern, except edges previously identified as seamless:
  - (i) automatically identifying at least one candidate edge which is suitable to be seamed to the edge;
  - (ii) if a plurality of candidate edges have been identified, selecting one of the plurality of candidate edges based on at least one three-dimensional geometric criterion, wherein selecting one of the plurality of candidate edges comprises:
    - sorting the candidate edges according to their distance from the edge; and
    - filtering out a candidate edge with a shortest distance from the edge if it fulfils a set of impossibility conditions, said impossibility conditions comprising at least an orientation mismatch with the edge higher than a threshold; and
  - (iii) defining a seam between the edge and the selected, or the only, candidate edge; and
- assembling the virtual garment or upholstery around the avatar according to the defined seams and performing a physical simulation of draping of the virtual garment or upholstery;

said identifying, selecting, defining, assembling, and performing being performed automatically by the processor.

12. A method of manufacturing a garment or upholstery comprising a plurality of two-dimensional patterns assembled by edges of the patterns, the method comprising:
a step of designing said garment or upholstery, including a sub-step of defining seams between said patterns by:
arranging said patterns around a three-dimensional avatar representing either a human or humanoid body or a piece of furniture, the position of each pattern depending on its situation within the assembled garment or upholstery, each pattern having a plurality of edges and at least one pattern having an edge previously identified as seamless;
for each edge of each pattern, except edges previously identified as seamless:
(i) automatically identifying at least one candidate edge which is suitable to be seamed to the edge;
(ii) if a plurality of candidate edges have been identified, selecting one of the plurality of candidate edges based on at least one three-dimensional geometric criterion, wherein selecting one of the plurality of candidate edges comprises:
sorting the candidate edges according to their distance from the edge; and
filtering out a candidate edge with a shortest distance from the edge if it fulfills a set of impossibility conditions, said impossibility conditions comprising at least an orientation mismatch with the edge higher than a threshold; and
(iii) defining a seam between the edge and the selected, or the only, candidate edge; and
assembling the virtual garment or upholstery around the avatar according to the defined seams and performing a physical simulation of draping of the virtual garment or upholstery;
said identifying, selecting, defining, assembling, and performing being performed automatically by a computer; and
a step of physically manufacturing said garment or upholstery, including assembling said patterns by realizing said seams.

\* \* \* \* \*